(12) United States Patent
Kim et al.

(10) Patent No.: US 11,442,655 B2
(45) Date of Patent: Sep. 13, 2022

(54) SEMICONDUCTOR DEVICE AND METHOD OF OPERATING THE SAME

(71) Applicant: SK hynix Inc., Gyeonggi-do (KR)

(72) Inventors: Young Gyun Kim, Gyeonggi-do (KR); Ki Woong Lee, Gyeonggi-do (KR); Sang Jin Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 13 days.

(21) Appl. No.: 17/083,500

(22) Filed: Oct. 29, 2020

(65) Prior Publication Data
US 2021/0397362 A1    Dec. 23, 2021

(30) Foreign Application Priority Data

Jun. 23, 2020  (KR) .................. 10-2020-0076706

(51) Int. Cl.
*G06F 3/00*    (2006.01)
*G06F 3/06*    (2006.01)
*G11C 7/04*    (2006.01)

(52) U.S. Cl.
CPC .......... *G06F 3/0653* (2013.01); *G06F 3/0617* (2013.01); *G06F 3/0679* (2013.01); *G11C 7/04* (2013.01)

(58) Field of Classification Search
CPC . G11C 7/04; G11C 11/40626; G11C 11/4091; G11C 11/40615; G11C 11/4076; G11C 11/4093; G11C 11/406; G11C 5/147; G11C 11/4074; G11C 11/4085; G11C 11/4087; G11C 11/409; G11C 11/4094; G11C 11/4096; G11C 11/4099; G11C 5/025; G11C 7/06; G11C 7/065; G11C 7/08; G11C 8/10; G11C 8/12; G11C 29/021; G11C 29/028; G11C 5/063; G11C 5/145; G11C 11/401; G11C 11/4097; G11C 2029/0407; G11C 29/12; G11C 29/12005; G11C 29/46; G11C 29/787; G11C 11/22;

(Continued)

(56) References Cited

U.S. PATENT DOCUMENTS 9,583,174 B1 * 2/2017 Kim .................. G11C 11/40615

FOREIGN PATENT DOCUMENTS

| KR | 10-1662760 | 10/2016 |
| KR | 10-1984899 | 5/2019 |

* cited by examiner

*Primary Examiner* — Thong Q Le
(74) *Attorney, Agent, or Firm* — IP & T Group LLP

(57) ABSTRACT

The present technology relates to a semiconductor device and a method of operating the same. The semiconductor device includes a sensing voltage generator configured to generate a temperature voltage having a voltage level determined according to an internal temperature of the semiconductor device and a reference voltage having a constant voltage level, a code generator configured to generate a temporary code including a sensing code value corresponding to the internal temperature and a boundary value indicating whether the internal temperature is included in a boundary portion associated with at least one temperature range corresponding to the sensing code value based on the temperature voltage and the reference voltage, and a code correction component configured to generate a correction code for generating an operation voltage of the semiconductor device by correcting the temporary code, based on the temporary code and a previously generated correction code.

19 Claims, 10 Drawing Sheets

(58) Field of Classification Search
CPC .............. G11C 11/221; G11C 11/2253; G11C 11/2273; G11C 11/2275; G11C 11/2293; G11C 11/2297; G11C 16/10; G11C 16/26; G11C 5/143; G11C 5/146; G11C 7/00; G11C 7/14; G11C 11/44; G11C 13/0002; G11C 16/30; G11C 2207/2227; G11C 29/08; G11C 29/50; G11C 5/14; G11C 5/144; G11C 5/148; G11C 7/062; G11C 7/12; G11C 7/225; G11C 8/08; G06F 3/0617; G06F 3/0653; G06F 3/0679; G06F 3/0659
USPC ................................ 365/51, 200, 189.05, 63
See application file for complete search history.

SEMICONDUCTOR DEVICE AND METHOD OF OPERATING THE SAME

CROSS-REFERENCE TO RELATED APPLICATION

The present application claims priority under 35 U.S.C. § 119(a) to Korean patent application number 10-2020-0076706, filed on Jun. 23, 2020, which is incorporated herein by reference in its entirety.

BACKGROUND

Field of Invention

The present disclosure relates to a semiconductor device, and more particularly, to a semiconductor device including a temperature sensor and a method of operating the same.

Description of Related Art

A memory device stores data, and may be a volatile memory device or a non-volatile memory device. In a volatile memory device stored data is lost when power supply is cut off. Examples of volatile memory devices include a static RAM (SRAM), a dynamic RAM (DRAM), a synchronous DRAM (SDRAM), and the like.

A non-volatile memory device retains stored data even in the absence of power. Examples of non-volatile memory devices include a flash memory, a read only memory (ROM), a programmable ROM (PROM), an electrically programmable ROM (EPROM), an electrically erasable and programmable ROM (EEPROM), a phase-change RAM (PRAM), a magnetic RAM (MRAM), a resistive RAM (RRAM), a ferroelectric RAM (FRAM), and the like. There are two types of flash memories: a NOR type and a NAND type.

A memory device may include a plurality of transistors, and an electrical characteristic thereof may vary according to a temperature. As a result, performance of the memory device may vary according to a temperature. Therefore, the memory device may include a digital temperature sensor (DTS) that provides temperature information for optimization of performance. To properly use such temperature information to that end, the DTS measures the temperature before performing an internal operation of the memory device, which then compensates for the internal operation according to the measured temperature.

However, since the DTS divides the temperature into a plurality of ranges and outputs codes corresponding to the plurality of non-overlapping ranges, when the measured temperature is at a boundary between two adjacent ranges, the output code varies even with a small temperature change.

SUMMARY

Embodiments of the present disclosure provide a semiconductor device capable of reducing noise by minimizing a code change generated by a small temperature change, and a method of operating the same.

A semiconductor device according to an embodiment of the present disclosure may generate an operation voltage for performing an internal operation according to a temperature. The semiconductor device may include a sensing voltage generator configured to generate a temperature voltage having a voltage level determined according to an internal temperature of the semiconductor device and a reference voltage having a constant voltage level, a code generator configured to generate a temporary code including a sensing code value corresponding to the internal temperature and a boundary value indicating whether the internal temperature is included in a boundary portion associated with at least one temperature range corresponding to the sensing code value based on the temperature voltage and the reference voltage, and a code correction component configured to generate a correction code for generating an operation voltage of the semiconductor device by correcting the temporary code, based on the temporary code and a previously generated correction code.

A method of operating a semiconductor device may include generating a temperature voltage having a voltage level determined according to an internal temperature of the semiconductor device and a reference voltage having a constant voltage level, generating a temporary code including a sensing code value corresponding to the internal temperature and a boundary value indicating whether the internal temperature is included in a boundary portion associated with at least one temperature range corresponding to the sensing code value based on the temperature voltage and the reference voltage, and generating a correction code for generating an operation voltage of the semiconductor device based on the temporary code and a previously generated correction code.

A memory device may include a sensing voltage generator configured to generate a temperature voltage corresponding to an internal temperature of the memory device, a code generator configured to generate a temporary code including a sensing code value corresponding to the internal temperature and a boundary value indicating whether the internal temperature falls within a boundary portion of two sensing code values based on the temperature voltage, and a code correction component configured to selectively correct the temporary code based on the boundary value and output the temporary code or the corrected temporary code as a code for generating an operation voltage of the memory device.

According to an embodiment of the present technology, a semiconductor device capable of reducing noise by minimizing a code change generated by a small temperature change, and a method of operating the same are provided.

DETAILED DESCRIPTION

Specific structural and functional description is provided only to describe the embodiments of the present disclosure. The present invention, however, may be implemented in various forms and carried out in various ways. Thus, the present invention is not limited to the disclosed embodiments nor to any particular detail provided herein. Specifically, although a semiconductor device is disclosed as being implemented as a memory device, this is only an embodiment; a semiconductor device may implemented in other forms. More generally, the semiconductor device may be implemented as any electronic device including a diode or a transistor.

Throughout the specification, when a portion is described as being "connected" to another portion, that includes an arrangement in which the portion is "directly connected" to the other portion as well as an arrangement in which the portion is "indirectly connected" to the other portion with another component interposed therebetween. Throughout the specification, a statement indicating that a portion includes a component is open-ended, meaning that the portion may include other components unless specifically stated otherwise. Also, throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
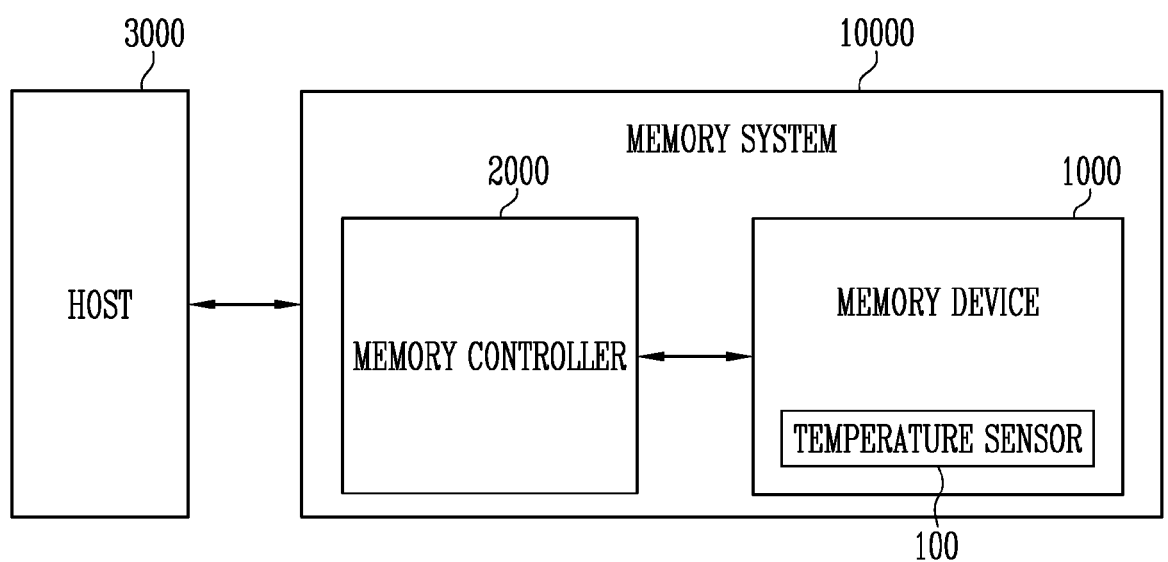
FIG. 1 is a diagram illustrating a memory system according to an embodiment of the present disclosure.

FIG. 1 is a diagram illustrating a memory system 10000 according to an embodiment of the present disclosure.

Referring to FIG. 1, the memory system 10000 may include a memory device 1000 and a memory controller 2000.

The memory system 10000 may store data under control of a host 3000 such as a cellular phone, a smartphone, an MP3 player, a laptop computer, a desktop computer, a game player, a tablet PC, or an in-vehicle infotainment system.

The memory system 10000 may be manufactured or configured as of various types of storage devices according to a host interface that is sets a communication protocol with the host 300. For example, the memory system 10000 may be configured as a solid state drive (SSD), a multimedia card in a form of an MMC, an eMMC, an RS-MMC or a micro-MMC, a secure digital card in a form of an SD, a mini-SD or a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-e or PCIe) card type storage device, a compact flash (CF) card, a smart media card, and/or a memory stick.

The memory system 10000 may be manufactured as any of various types of packages. For example, the memory system 10000 may be manufactured as a package on package (POP), a system in package (SIP), a system on chip (SOC), a multi-chip package (MCP), a chip on board (COB), a wafer-level fabricated package (WFP), and/or a wafer-level stack package (WSP).

The memory device 1000 may store data. The memory device 1000 may operate under control of the memory controller 2000. In addition, the memory device 1000 may include a memory cell array including a plurality of memory cells that store data. Each of the memory cells may be configured as a single level cell (SLC) storing one bit of data, a multi-level cell (MLC) storing two bits of data, a triple level cell (TLC) storing three bits of data, or a quad level cell (QLC) storing four bits of data.

The memory cell array may include a plurality of memory blocks. Each memory block may include a plurality of memory cells. In addition, one memory block may include a plurality of pages. In an embodiment, the page may be a unit for storing data in the memory device 1000 or reading data stored in the memory device 1000. The memory block may be a unit for erasing data.

In an embodiment, the memory device 1000 may be implemented as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, by way of example, the memory device 1000 is described as a NAND flash memory. However, the present invention is not limited thereto, as the memory device 1000 may be implemented as any of various memory devices 1000.

The memory device 1000 may be a NAND flash memory. The memory device 1000 may receive a command and an address from the memory controller 2000. The memory device 1000 may be configured to access an area selected by the received address of the memory cell array. Accessing the selected area may mean performing an operation corresponding to the received command on the selected area. For example, the memory device 1000 may perform an internal operation including a write operation (i.e., program operation), a read operation, and an erase operation. During the program operation, the memory device 1000 may program data to the area selected by the address. During the read operation, the memory device 1000 may read data from the area selected by the address. During the erase operation, the memory device 1000 may erase data stored in the area selected by the address.

In another embodiment, the memory device 1000 may be a dynamic random access memory (DRAM). The memory device 1000 may receive a command and an addresses from the memory controller 2000. The memory device 1000 may be configured to access an area selected by the received address of the memory cell array. Accessing the selected area may mean performing an operation corresponding to the received command on the selected area. For example, the memory device 1000 may perform a data input/output operation or a refresh operation. The data input/output operation may be an operation in which the memory device 1000 receives data to store data in the area selected by the address or outputs and reads the stored data. The refresh operation may be an operation in which the memory device 1000 preserves the stored data.

The memory device 1000 may include memory cells. In response to control of the memory controller 2000, the memory device 1000 may perform the internal operation on select memory cells. The internal operation may include a program operation, a read operation, or an erase operation. In another embodiment, the internal operation may include a data input/output operation or a refresh operation.

The memory controller 2000 may control overall operation of the memory system 10000. When power is applied to the memory system 10000, the memory controller 2000 may execute firmware (FW). The firmware FW may include a host interface layer HIL that receives a request input from the host 3000 or outputs a response to the host 3000, a flash translation layer (FTL) that manages an operation between an interface of the host 3000 and an interface of the memory device 1000, and a flash interface layer (FIL) that provides a command to the memory device 1000 or receive the response from the memory device 1000.

The memory controller 2000 may receive data and a logical address (LA) from the host 3000, and may translate the logical address into a physical address (PA) indicating an address of memory cells in the memory device 1000 in which data is to be stored. The LA may be a logical block address (LBA), and the PA may be a physical block address (PBA).

The memory controller 2000 may control the memory device 1000 to perform an internal operation including a program operation, a read operation, or an erase operation according to a request of the host 3000. During the program operation, the memory controller 2000 may provide a program command, the PBA, and data to the memory device 1000. During the read operation, the memory controller 2000 may provide a read command and the PBA to the memory device 1000. During the erase operation, the memory controller 2000 may provide an erase command and the PBA to the memory device 1000.

Alternatively, the memory controller 2000 may control the memory device 1000 to perform the internal operation including the program operation, the read operation, or the erase operation by itself without any request from the host 3000. For example, the memory controller 2000 may control the memory device 100 to perform the program operation, the read operation, or the erase operation used to perform a background operation such as wear leveling, garbage collection, or read reclaim.

In an embodiment, the memory device 1000 may include a temperature sensor 100 and the memory controller 2000 may control the temperature sensor 100. Specifically, the memory controller 2000 may generate a temperature measurement command, and may control the temperature sensor 100 to sense a temperature of the memory device 1000, in response to the generated temperature measurement command. Alternatively, the memory controller 2000 may indirectly control the temperature sensor 100 by controlling the memory device 1000 so that the memory device 1000 generates the temperature measurement command.

In an embodiment, as the memory device 1000 performs the internal operation, an internal temperature of the memory device 1000 may change. The internal temperature may correspond to the temperature of the memory device 1000 or may correspond to a temperature of the memory cell array. As the number or extent of internal operations of the memory device 1000 increases, the internal temperature of the memory device 1000 may increase. When the internal temperature of the memory device 1000 is excessively high, a possibility of deterioration of the memory device 1000 may increase. That is, since, when the internal temperature of the memory device 1000 is excessively high, a probability that the internal operation of the memory device 1000 is failed increased, performance of the memory device 1000 may be deteriorated. Therefore, the memory controller 2000 may control the temperature sensor 100 or the memory device 1000 to measure the temperature whenever an internal operation of the memory device 1000 is performed. In addition, when the internal temperature is excessively high, the memory controller 2000 may limit the internal operation of the memory device 1000 so that the internal temperature of the memory device 1000 decreases. The memory controller 2000 may control the memory device 1000 so that the internal temperature of the memory device 1000 decreases by limiting the internal operation(s) of the memory device 1000. Here, examples of internal operations include a program operation, a read operation, or an erase operation, and may also include a background operation such as a wear leveling, garbage collection, read reclaim, and the like.

The temperature sensor 100 may be implemented as a digital temperature sensing circuit, and may convert the temperature into a code that is a digital signal and output the code. That is, the temperature sensor 100 may convert an analog signal to a digital signal and output the digital signal. Specifically, the temperature sensor 100 may output a code corresponding to the measured internal temperature, and may transmit the output code to the memory device 1000 or the memory controller 2000.

Here, as the number of bits allocated to the code increases, resolution may increase. The resolution may refer to a temperature section (or temperature range) corresponding to the code. As the resolution increases, the temperature range corresponding to one code may decrease. For example, when the resolution is low, a small number of bits may be allocated, and thus the temperature range corresponding to one code may be 20° C. When the temperature is 0° C., 10° C., and 20° C., the output code in each instance may be 1. On the other hand, when the resolution is high, a high number of bits may be allocated, and thus the temperature range corresponding to one code may be 1° C. When the temperature is 0° C., 10° C., and 20° C., the corresponding output codes may be 0, 10, and 20, respectively. That is, as the resolution increases, a difference between the codes output at the same temperature difference increases. Therefore, a difference between an actual temperature and the temperature indicated by the generated code may decrease, and an actual internal temperature corresponding to the code may be accurately expressed.

In some embodiments, the temperature sensor 100 may sense the internal temperature of the memory device 1000 or the memory system 10000 in response to a command (for example, the temperature measurement command) transmitted from the memory device 1000 or the memory controller 2000, and may output the code corresponding to the sensed internal temperature. Alternatively, the temperature sensor 100 may perform an operation of sensing the internal temperature of the memory device 1000 or the memory system 10000 and outputting the code at one or more set times, e.g., periodically, without a command from the memory device 1000 or the memory controller 2000. The memory device 1000 or the memory controller 2000 may derive the temperature of the memory device 1000 or the memory controller 2000 based on the code output from the temperature sensor 100. Detailed operation method of the temperature sensor 100 is described later with reference to FIG. 3.

The host 3000 may communicate with the memory system 10000 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and/or a load reduced DIMM (LRDIMM).

In the illustrated example of FIG. 1, one temperature sensor 100 is included in one memory device 1000, but this is only one embodiment. When the temperature sensor 100 is implemented, the temperature sensor 100 may be disposed in, or operably coupled to, the memory device 1000, or a plurality of memory devices 1000 may be operably coupled to one temperature sensor 100, in which case the temperature sensor 100 may be implemented as a separate electronic device.

Figure 2:
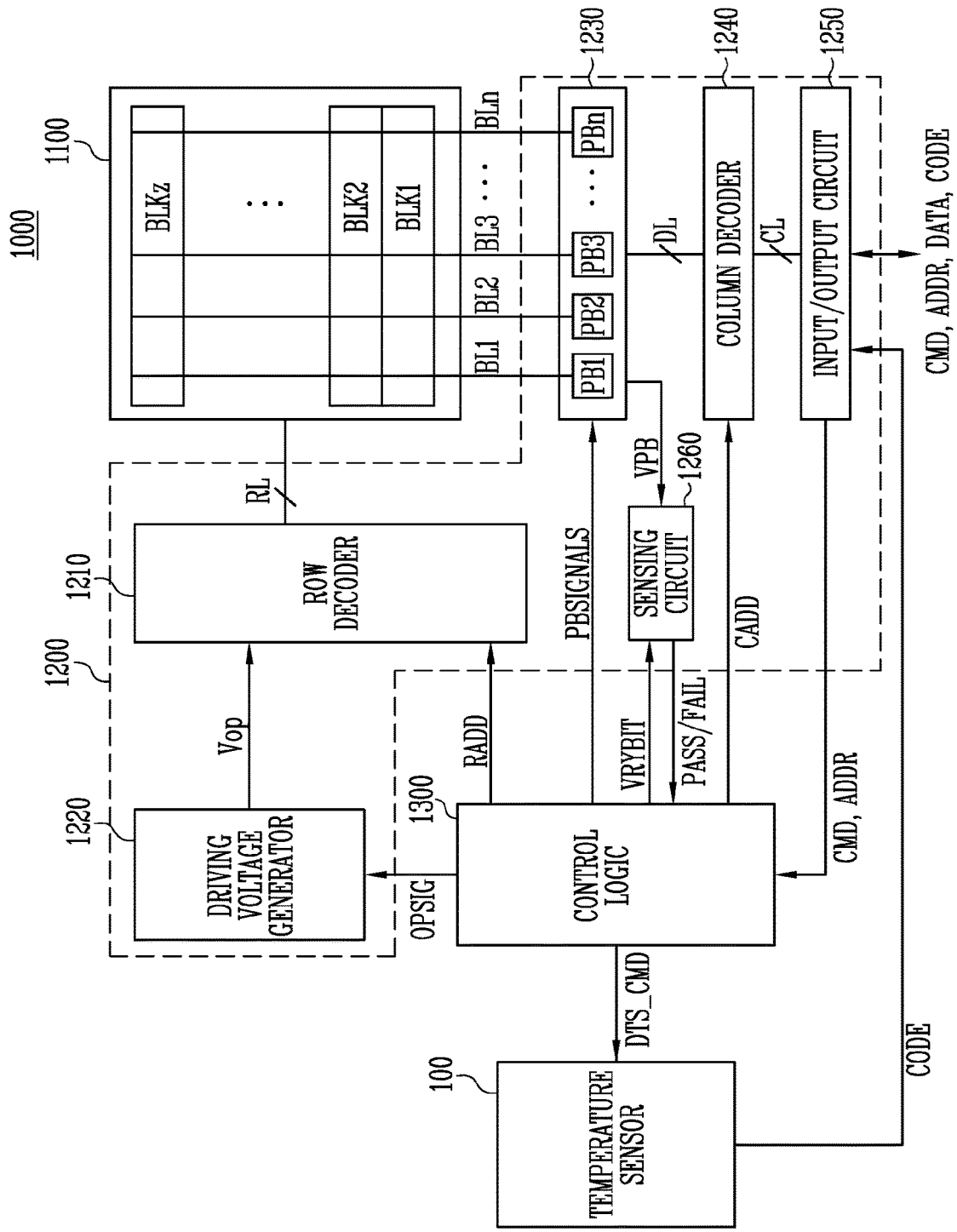
FIG. 2 is a diagram illustrating a memory device according to an embodiment of the present disclosure.

FIG. 2 is a diagram illustrating a memory device 1000 according to an embodiment of the present disclosure.

Referring to FIG. 2, the memory device 1000 may include a memory cell array 1100, a peripheral circuit 1200, control logic 1300, and a temperature sensor 100. By way of example, in FIG. 2, it is assumed that the memory device 1000 is a NAND flash memory, but the invention is not limited thereto, as the memory device 1000 may be implemented as any of various memory devices or semiconductor devices.

The memory cell array 1100 may include a plurality of memory blocks BLK1 to BLKz. The plurality of memory blocks BLK1 to BLKz may be connected to a row decoder 1210 through row lines RL. In addition, the memory blocks BLK1 to BLKz may be connected to a page buffer group 1230 through bit lines BL1 to BLn. Each of the plurality of memory blocks BLK1 to BLKz may include a plurality of memory cells. In an embodiment, the plurality of memory cells may be non-volatile memory cells. Memory cells connected to the same word line may be defined as one page. That is, the memory cell array 1100 may be configured of a plurality of physical pages. Therefore, one memory block may include a plurality of pages.

Each of the memory cells in the memory cell array 110 may be configured as a single level cell (SLC) storing one bit of data, a multi-level cell (MLC) storing two bits of data, a triple level cell (TLC) storing three bits of data, or a quad level cell (QLC) storing four bits of data.

The peripheral circuit 1200 may be configured to perform a program operation, a read operation, or an erase operation on a selected area of the memory cell array 1100 under control of the control logic 1300. The peripheral circuit 1200 may drive the memory cell array 1100. For example, the peripheral circuit 1200 may apply various operation voltages to the row lines RL and the bit lines BL1 to BLn or discharge the applied voltages under the control of the control logic 1300.

The peripheral circuit 1200 may include the row decoder 1210, a driving voltage generator 1220, a page buffer group 1230, a column decoder 1240, an input/output circuit 1250, and a sensing circuit 1260.

The peripheral circuit 1200 may drive the memory cell array 1100. For example, the peripheral circuit 1200 may drive the memory cell array 1100 to perform a program operation, a read operation, and an erase operation.

The row decoder 1210 may be connected to the memory cell array 1100 through the row lines RL. The row lines RL may include at least one source select line, a plurality of word lines, and at least one drain select line. In an embodiment, the word lines may include normal word lines and dummy word lines. The row lines RL may further include a pipe select line.

The row decoder 1210 may be configured to operate in response to the control of the control logic 1300. The row decoder 1210 may receive a row address RADD from the control logic 1300. In addition, the row decoder 1210 may be configured to decode the row address RADD.

The row decoder 1210 may select at least one memory block among the memory blocks BLK1 to BLKz according to a decoded address. In addition, the row decoder 1210 may select at least one word line of the memory block selected to apply voltages generated by the driving voltage generator 1220 to at least one word line WL according to the decoded address.

For example, during the program operation, the row decoder 1210 may apply a program voltage to a selected word line and apply a program pass voltage of a level lower than that of the program voltage to unselected word lines. During a program verify operation, the row decoder 1210 may apply a verify voltage to the selected word line and apply a verify pass voltage higher than the verify voltage to the unselected word lines. During the read operation, the row decoder 1210 may apply a read voltage to the selected word line and apply a read pass voltage higher than the read voltage to the unselected word lines.

In an embodiment, the erase operation of the memory device 1000 may be performed in a memory block unit. During the erase operation, the row decoder 1210 may select one memory block according to the decoded address. Further, the row decoder 1210 may apply a ground voltage to word lines connected to the selected memory block.

The driving voltage generator 1220 may operate in response to the control of the control logic 1300. The driving voltage generator 1220 may be configured to generate a plurality of voltages using an external power voltage supplied to the memory device 1000. Specifically, the driving voltage generator 1220 may generate various operation voltages Vop used for the program, read, and erase operations in response to operation signal OPSIG. For example, the driving voltage generator 1220 may generate a program voltage, a verify voltage, a pass voltage, a read voltage, an erase voltage, and the like in response to the control of the control logic 1300.

In an embodiment, the driving voltage generator 1220 may generate an internal power voltage by regulating an external power voltage. The internal power voltage may be used as an operation voltage of the memory device 1000. That is, the driving voltage generator 1220 may generate a plurality of voltages using an external power voltage or an internal power voltage.

For example, the driving voltage generator 1220 may include a plurality of pumping capacitors that receive the internal power voltage, and selectively activate the plurality of pumping capacitors in response to the control of the control logic 1300 to generate the plurality of voltages. The generated plurality of voltages may be supplied to the memory cell array 110 by the row decoder 1210.

In addition, the driving voltage generator 1220 may include a bandgap reference or a bandgap reference circuit to provide a constant fixed voltage to the temperature sensor 100 independent of the temperature and regardless of circuit load. That is, the driving voltage generator 1220 may provide the fixed voltage to the temperature sensor 100 so that the temperature sensor 100 may generate the code according to the temperature.

In an embodiment, the driving voltage generator 1220 may receive the code output from the temperature sensor 100 and compensate for the operation voltage according to the received code. For example, the driving voltage generator 1220 may generate the program voltage, the verify voltage, the pass voltage, the read voltage, and the erase voltage according to the received code.

During the program operation, the driving voltage generator 1220 may change a program voltage Vpgm applied to the selected word line, a pass voltage VpassP applied to an unselected word line, or a voltage VPDSL applied to the drain select line according to the code.

During the read operation, the driving voltage generator 1220 may change a read voltage Vpbsense or a pass read voltage VpassR applied to a PB sense transistor to check an evaluation of each bit of the word line, according to the received code.

During the erase operation, the driving voltage generator 1220 may change voltages VGIDL_DSL and VGIDL_SSL applied to the drain select line and the source select line and an erase voltage Verase applied to generate a GIDL in the block according to the received code.

In some embodiments, a change value ΔVpgm of the program voltage, a change value ΔVpbsense of the read voltage, or a change value ΔVerase of the erase voltage according to the change of the code may be different from each other. In addition, the change value ΔVpgm of the program voltage and a change value ΔVpassP of the program pass voltage may be the same, and may be greater than the change value ΔVpbsense of the read voltage. In addition, the change value ΔVerase of the erase voltage may be greater than the change value ΔVpbsense of the read voltage.

Figure 3:
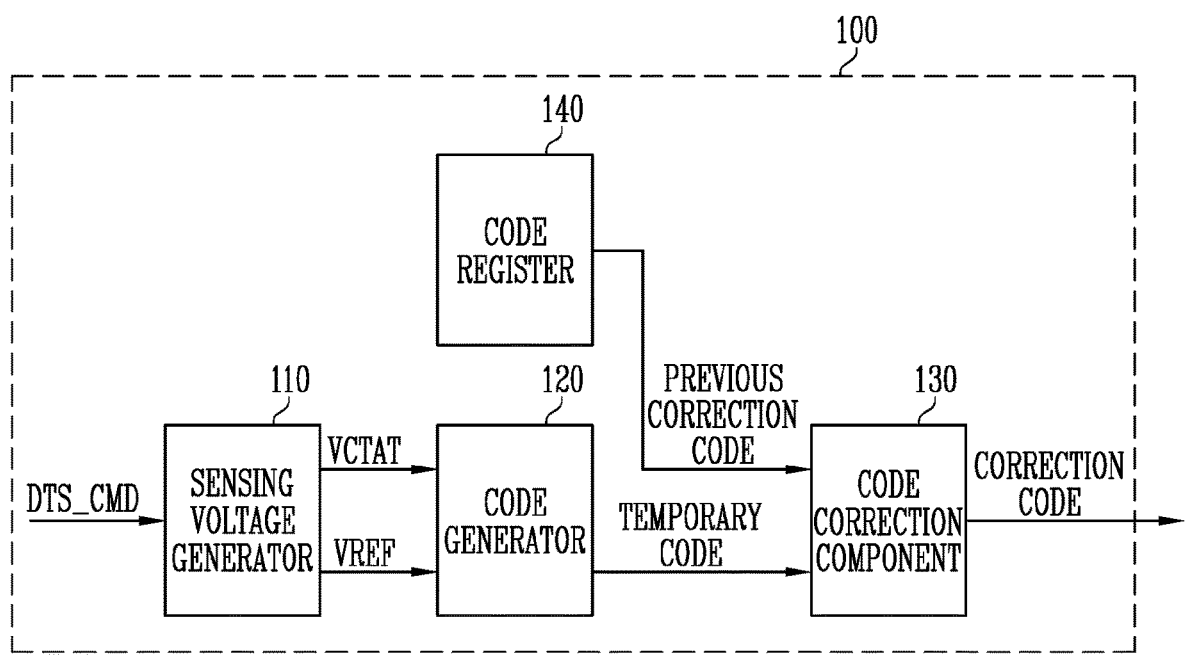
FIG. 3 is a diagram illustrating a temperature sensor according to an embodiment of the present disclosure.

By way of example, the driving voltage generator 1220 and a sensing voltage generator 110 shown in FIG. 3 may be separate components, but this is only an embodiment. Alternatively, the driving voltage generator 1220 may be implemented to include the sensing voltage generator 110.

The buffer group 1230 may include first to n-th page buffers PB1 to PBn, which may be connected to the memory cell array 110 through the first to n-th bit lines BL1 to BLn, respectively. The first to n-th page buffers PB1 to PBn may operate under the control of the control logic 1300. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage of a current of the bit lines BL1 to BLn during the read or verify operation.

Specifically, during the program operation, when a program pulse is applied to the selected word line, the first to n-th page buffers PB1 to PBn may transfer data DATA, which is received through the data input/output circuit 1250, to selected memory cells through the first to n-th bit lines BL1 to BLn. The memory cells of the selected page may be programmed according to the transferred data DATA. A memory cell connected to a bit line to which a program permission voltage (for example, the ground voltage) is applied may have an increased threshold voltage. A threshold voltage of a memory cell connected to a bit line to which a program prohibition voltage (for example, the power supply voltage) is applied may be maintained. During the program verify operation, the first to n-th page buffers PB1 to PBn may read page data from the selected memory cells through the first to n-th bit lines BL1 to BLn.

During the read operation, the first to n-th page buffers PB1 to PBn may read the data DATA from the memory cells of a selected page through the first to n-th bit lines BL1 to BLn, and output the read data DATA to the data input/output circuit 1250 under control of the column decoder 1240.

During the erase operation, the first to n-th page buffers PB1 to PBn may float the first to n-th bit lines BL1 to BLn.

The column decoder 1240 may transfer data between the input/output circuit 1250 and the page buffer group 1230 in response to the column address CADD. For example, the column decoder 1240 may exchange data with the first to n-th page buffers PB1 to PBn through data lines DL or may exchange data with the input/output circuit 1250 through column lines CL.

The input/output circuit 1250 may transfer the command CMD and the address ADDR received from the memory controller 2000 to the control logic 1300, or may exchange the data DATA with the column decoder 1240. In an embodiment, the code for the temperature may be transferred to the memory controller 2000 through the input/output circuit 1250. The code may represent a value obtained by measuring the internal temperature of the memory device 1000, which is measured by the temperature sensor 100.

The sensing circuit 1260 may generate a reference current in response to a permission bit signal VRYBIT during the read operation or the verify operation. Further, the sensing circuit 1260 may compare a sensing voltage VPB received from the page buffer group 1230 with a reference voltage, which is generated by the reference current, to output a pass signal PASS or a fail signal FAIL.

The control logic 1300 may output the operation signal OPSIG, the row address RADD, the page buffer control signals PBSIGNALS, the permission bit VRYBIT, and a temperature sensor control signal DTS_CMD in response to the command CMD and the address ADDR to control the peripheral circuit 1200 and the temperature sensor 100. In addition, the control logic 1300 may determine whether the verify operation is passed or failed in response to the pass or fail signal PASS or FAIL.

The control logic 1300 may transmit the temperature sensor control signal DTS_CMD to the temperature sensor 100. The temperature sensor 100 may generate the code corresponding to the measured temperature in response to the temperature sensor control signal DTS_CMD. The control logic 1300 may transmit the temperature sensor control signal DTS_CMD at a set frequency, that is, periodically, and transmit the temperature sensor control signal DTS_CMD to the temperature sensor 100 as the internal operation of the memory device 1000 is performed.

In the illustrated example of FIG. 2, the temperature sensor 100 is disposed within the memory device 1000. Alternatively, the temperature sensor 100 may be implemented as a separate component disposed externally to the memory device 1000. Specific configuration and operation of the temperature sensor 100 are described in detail with reference to FIG. 3.

FIG. 3 is a diagram illustrating a temperature sensor 100 according to an embodiment of the present disclosure.

Referring to FIG. 3, the temperature sensor 100 may include a sensing voltage generator 110, a code generator 120, a code correction component 130, and a code register 140.

The temperature sensor 100 may generate the code corresponding to the temperature measured in response to the temperature sensor control signal DTS_CMD. In some embodiments, the temperature sensor control signal DTS_CMD may be generated at a set frequency, i.e., periodically, and the temperature sensor 100 may receive the temperature sensor control signal DTS_CMD at each such time. Alternatively, the temperature sensor control signal DTS_CMD may be input to the temperature sensor 100 before the internal operation of the memory device 1000 is performed for each time the internal operation of the memory device 1000 is performed.

The sensing voltage generator 110 may generate a temperature voltage VCTAT and a reference voltage VREF in response to the received temperature sensor control signal DTS_CMD. Specifically, the sensing voltage generator 110 generate the temperature voltage VCTAT having a voltage level determined according to the temperature and the reference voltage VREF having a constant voltage level even as temperature changes, using the voltage received from the driving voltage generator 122.

The temperature voltage VCTAT may correspond to, or be indicative of, the temperature, and as such, the level of VCTAT may increase or decrease according to change in temperature. The sensing voltage generator 110 may include a transistor of which a threshold voltage changes according to the temperature change or a resistor of which a resistance value changes according to the temperature change. The sensing voltage generator 110 may generate the temperature voltage VCTAT using the transistor or the resistor.

In some embodiments, the reference voltage VREF may be controlled to have a constant voltage level regardless of temperature change. Specifically, the reference voltage VREF may include a relatively high voltage VREF+ and a relatively low voltage VREF−. In addition, the sensing voltage generator 110 may be implemented in a form including a band gap voltage generation circuit or a Widlar voltage generation circuit to have a constant potential regardless of temperature change.

The code generator 120 may generate a temporary code based on the temperature voltage VCTAT and the reference voltage VREF, which are received from the sensing voltage generator 110. In some embodiments, each of the temperature voltage VCTAT and the reference voltage VREF may be an analog value including internal temperature information of the memory device 1000, and the temporary code may be a digital value. The digital code may include a sensing code value corresponding to the temperature and a boundary value indicating whether the measured temperature is included in a boundary portion of sub range of the temperature indicated by the sensing code value. Therefore, the code generator 120 may be implemented as an analog to digital converter (ADC) that converts the temperature voltage VCTAT and the reference voltage VREF, which are analog signals, into the digital code.

Figure 4:
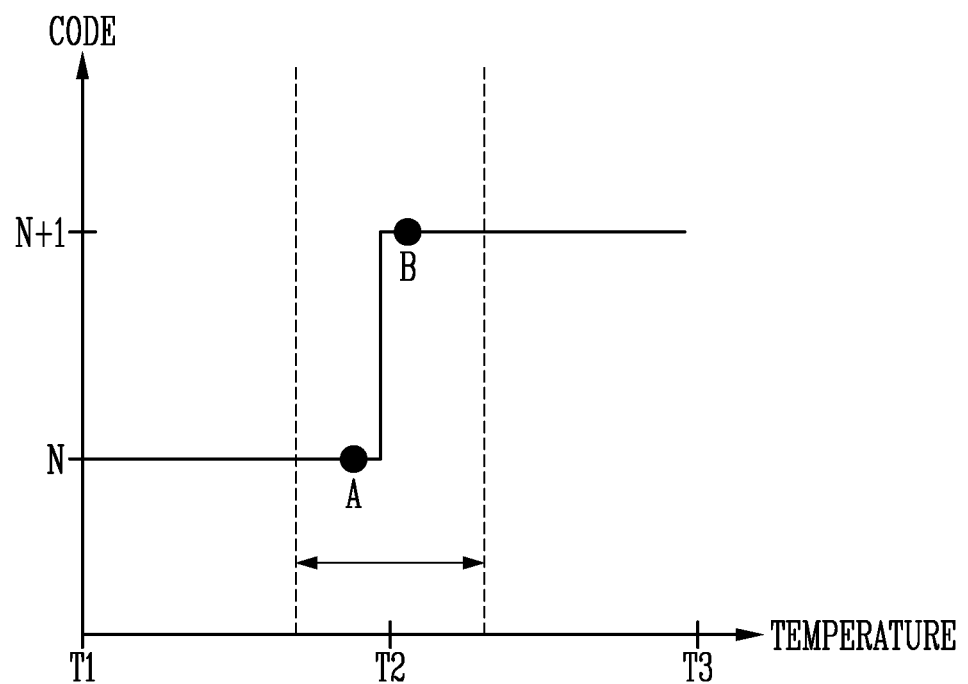
FIG. 4 is a diagram illustrating a boundary value according to an embodiment of the present disclosure.

As described above, the temporary code may include the sensing code value and the boundary value. FIG. 4 is a diagram illustrating a boundary value according to an embodiment of the present disclosure.

Referring to FIG. 4, code values N and N+1 are output according to a first temperature sub range T1 to T2 and a second temperature range T2 to T3, respectively. That is, the code generator 120 of FIG. 3 may output the code value N when the measured temperature is included in the first temperature sub range T1 to T2 and may output the code value N+1 when the measured temperature is included in the second temperature sub range T2 to T3.

In the illustrated example of FIG. 4, temperature A in the first temperature sub range T1 to T2 may be less than temperature T2 by a very small value dT, and temperature B in the second temperature sub range T2 to T3 may be greater than T2 by very small value dT. For example, when the temperature A is (T2−dT) and the temperature B is (T2+dT), a code corresponding to A may be output as N, and a code corresponding to B may be output as (N+1). That is, when the temperature is close to a boundary between two adjacent sub ranges, at which the code is changed, the output code may be changed according to a change of dT. In a case of a semiconductor device or the memory device 1000 including a low resolution DTS, a compensation value may vary greatly according to the output code. According to an embodiment of the present disclosure, the output code may be prevented from being changed according to a small temperature change, by using a boundary value indicating whether the measured temperature is included in a boundary portion associated with a sub range of the temperature indicated by the sensing code value.

Specifically, the temperature sensor 100 may divide a measurable temperature range into a plurality of sections, i.e., sub ranges, according to the resolution or the number of bits of the code, and output a sensing code corresponding to each of the sub ranges.

TABLE 1

| Temperature range | Sensing code | Sensing code (reverse order) |
|---|---|---|
| −40° C.~−30° C. | 0 | 15 |
| −30° C.~−20° C. | 1 | 14 |
| −20° C.~−10° C. | 2 | 13 |
| ... | ... | ... |
| 90° C.~100° C. | 13 | 2 |
| 100° C.~110° C. | 14 | 1 |
| 110° C.~120° C. | 15 | 0 |

Referring to [Table 1], the temperature range and the sensing code according to an embodiment of the present disclosure are shown. Assuming that the temperature sensor 100 implements a resolution corresponding to 4 bits with respect to the temperature range of −40° C. to 120° C., one code may be allocated for every 10° C. sub range. For example, a temperature sub range of −40° C. to −30° C. may correspond to code 0, and a temperature sub range of 110° C. to 120° C. may correspond to code 15. Alternatively, codes respectively corresponding to the temperature sub ranges may be mapped in reverse order. For example, the temperature sub range of −40° C. to −30° C. may correspond to code 15, and the temperature sub range of 110° C. to 120° C. may correspond to code 0.

A semiconductor device (for example, the memory device 1000) including the temperature sensor 100 may operate in a temperature range of −40° C. to 120° C., and the temperature sensor 100 may sense the temperature in that range. Alternatively, the temperature range may be determined according to a specification of the temperature sensor 100 or a throttling temperature of the semiconductor device (for example, the memory device 1000). In addition, the sensing code may be set to the resolution corresponding to 4 bits (i.e., 16 codes). When a high bit number code is mapped to the same temperature range, a temperature difference according to a code difference may become small. In addition, a high resolution may be implemented by mapping a high number of bits to the same temperature range.

In addition, the temperature sensor 100 may set a set portion of each temperature sub range as a boundary portion. The temperature sensor 100 may indicate whether the measured temperature is included in a boundary portion of a temperature range corresponding to a specific code using the boundary value. That is, the temperature sensor 100 may indicate whether the measured temperature is close to a boundary where the code is changed, using the boundary value.

Specifically, the temperature sensor 100 may indicate a logic value of 1 when the measured temperature is included in a boundary portion, and may indicate a logic value of 0 when the measured temperature is not included in the boundary portion. For example, the temperature A and the temperature B may be in boundary portions of adjacent temperature sub ranges because each is dT from the common boundary. Thus, a boundary value corresponding to each of A and B may be a logic value of 1. In addition, it may be determined that each of temperature A and B is close to the boundary.

That is, the boundary value may indicate whether the measured internal temperature is near a boundary where the sensing code value is changed. The temperature sensor 100 may allocate the least bit (for example, 1 bit). In addition, each code value may indicate two boundary portions which together span two adjacent sub ranges, and a boundary portion represented in one code value may be ½ or less of the corresponding code. For example, when the sub temperature range corresponding to sensing code 2 is −20° C. to −10° C., and the sub temperature range corresponding to sensing code 3 is −10° C. to 0° C., −7.5° C. to −10° C. and −10° C. to −12.5° C., which are boundaries of −10° C. may be the boundary portion(s).

Referring again to FIG. 3, the temperature sensor 100 may include the code correction component 130 and the code register 140.

The code correction component 130 may correct the temporary code generated by the code generator 120 to generate a correction code for use in generating an operation voltage of the semiconductor device. In some embodiments, the temporary code may include the sensing code value corresponding to the internal temperature and the boundary value indicating whether the internal temperature is included in the boundary portion of the sub range of the temperature indicated by the sensing code value.

The code correction component 130 may correct the sensing code value of the temporary code according to the boundary value, or output the sensing code value of the temporary code as is. Specifically, when the measured internal temperature does not fall within a boundary portion, the code correction component 130 may output the sensing code value of the temporary code as the correction code. That is, when the boundary value is 0, the code correction component 130 may output the sensing code value of the temporary code as the correction code.

On the other hand, when the measured internal temperature is included in the boundary portion of the sensing code, the code correction component 130 may generate the correction code by comparing the sensing code value generated by the code generator 120 with a previously generated correction code. That is, when the boundary value is 1, the code correction component 130 may generate the correction code by comparing the sensing code value with the previously generated correction code.

The code register 140 may store the previously generated correction code. The code correction component 130 may correct the sensing code value in order to minimize a difference between a newly generated correction code and the previously generated correction code when the measured internal temperature is included in the boundary portion. Specifically, the code correction component 130 may generate the correction code by adding 1 to the sensing code value of the temporary code when the sensing code value of the temporary code is less than the previously generated correction code. On the other hand, the code correction component 130 may output the sensing code value of the temporary code as the correction code when the sensing code value of the temporary code is greater than or equal to the previously generated correction code.

The correction code newly generated by the code correction component 130 may be stored in the code register 140 for correction of the internal temperature that is measured later and the temporary code.

Figure 5:
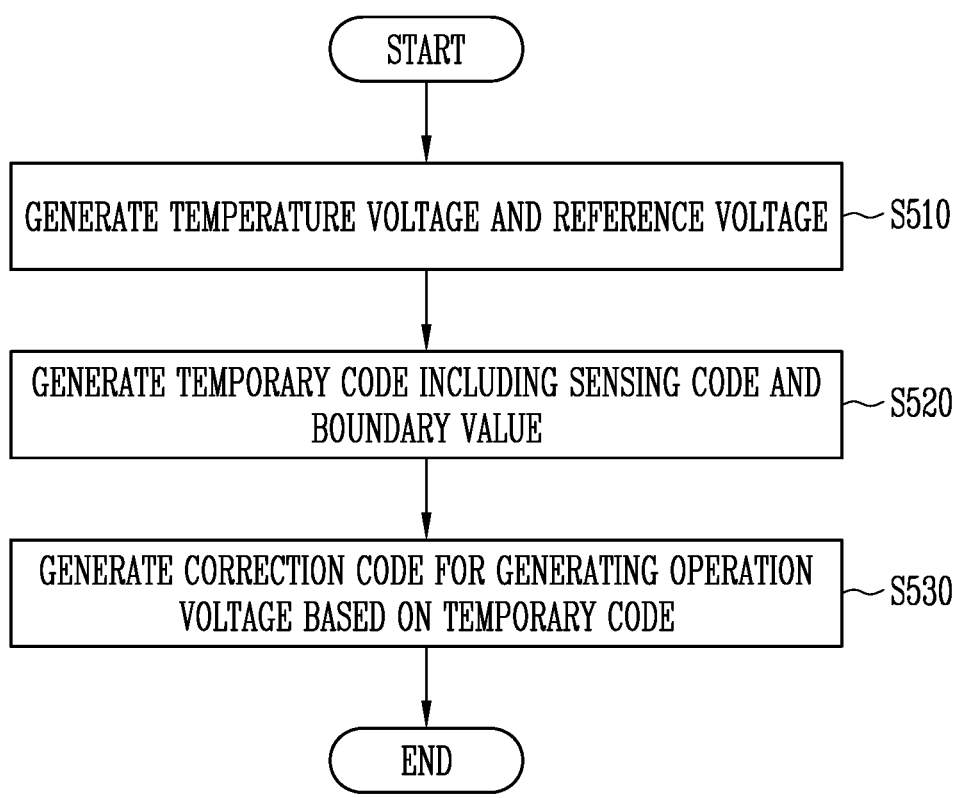
FIG. 5 is a flowchart illustrating a method of operating a semiconductor device according to an embodiment of the present disclosure.

FIG. 5 is a flowchart illustrating a method of operating a semiconductor device according to an embodiment of the present disclosure.

The semiconductor device may generate the code according to the temperature measured in response to the temperature control signal DTS_CMD.

Referring to FIG. 5, in operation S510, the semiconductor device may generate the temperature voltage and the reference voltage. Specifically, the semiconductor device may generate the temperature voltage having a voltage level determined according to the internal temperature and the reference voltage having a constant voltage level even when the internal temperature changes. Here, the temperature voltage may be a voltage corresponding to the temperature, and the level may be set to increase or decrease according to the temperature change. The reference voltage may have a constant voltage level regardless of the temperature change, and may include a relatively high voltage VREF+ and a relatively low voltage VREF−.

In operation S520, the semiconductor device may generate the temporary code based on the temperature voltage and the reference voltage. In some embodiments, the temperature voltage and the reference voltage may be analog values including the internal temperature information of the semiconductor device. The temporary code may be a digital value including the sensing code value corresponding to the internal temperature and the boundary value indicating whether the internal temperature is included in the boundary portion of the sensing code value. That is, the semiconductor device may convert the temperature voltage and the reference voltage, which are analog signals, into the temporary code that is a digital signal.

In some embodiments, the boundary value may indicate whether the measured internal temperature is included in a portion of a sub range adjacent to the boundary where the sensing code value is changed, and the least bit (for example, 1 bit) may be allocated for that purpose. For example, the boundary value may be a logic value of 1 when the measured internal temperature is included in the boundary portion of the sensing code value, and may be a logic value of 0 when the measured internal temperature is not included in the boundary portion of the sensing code value.

In operation S530, the semiconductor device may generate the correction code based on the temporary code. Specifically, the semiconductor device may generate the correction code for generating the operation voltage of the semiconductor device based on the temporary code and the previously generated correction code. A method for the semiconductor device to generate the correction code is described in detail with reference to FIG. 6.

Figure 6:
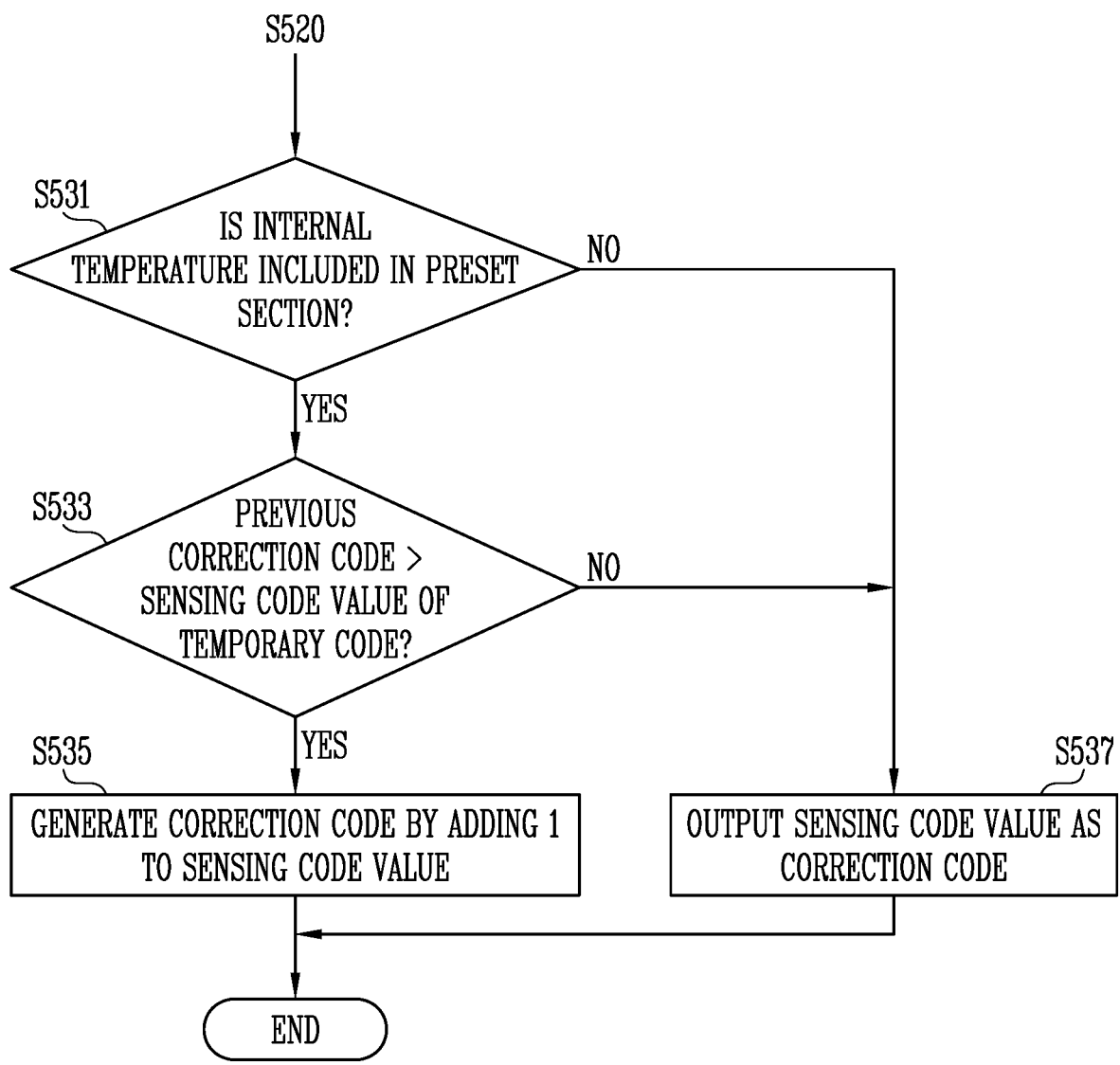
FIG. 6 is a diagram illustrating a method of generating a correction code according to an embodiment of the present disclosure.

FIG. 6 is a diagram illustrating a method of generating a correction code according to an embodiment of the present disclosure.

Referring to FIG. 6, in operation S531, the semiconductor device may identify whether the measured internal temperature is included in the boundary portion of the sensing code value. To do so, the semiconductor device may refer to the boundary value in the temporary code. When the boundary value is 1, the semiconductor device may determine that the internal temperature of the semiconductor device is included in the boundary portion of the sensing code value (S531—YES). When the boundary value is 0, the semiconductor device may determine that the internal temperature of the semiconductor device is not included in the boundary portion of the sensing code value (S531—NO). When the internal temperature of the semiconductor device is included in the boundary portion of the sensing code as indicated by the boundary value (S531—YES), the semiconductor device may perform operation S533. When the internal temperature of the semiconductor device is not included in the boundary portion of the sensing code as indicated by the boundary value (S531—NO), the semiconductor device may perform operation S537.

In operation S533, the semiconductor device may compare the previously generated correction code with the sensing code value of the temporary code. Specifically, the semiconductor device may store the previously generated correction code, and compare the previously stored and generated correction code with the sensing code value of the temporary code. When the previously generated correction code is greater than the sensing code value of the temporary code (S533—YES), the semiconductor device may perform operation S535. When the previously generated correction code is less than or equal to the sensing code value of the temporary code (S533—NO), the semiconductor device may perform operation S537.

In operation S535, the semiconductor device may generate the correction code by adding 1 (or a set value) to the sensing code value of the temporary code. Since the measured internal temperature is included in the portion adjacent to the boundary where the sensing code value is changed and the sensing code value of the temporary code is less than the previously generated correction code, the semiconductor device may generate the correction code by adding 1 to the sensing code value of the temporary code, to minimize the difference between the newly generated correction code and the previously generated correction code.

In operation S537, the semiconductor device may output the sensing code value of the temporary code as the correction code. The semiconductor device performs operation S537 when the internal temperature is not included in the boundary portion of the sensing code (S531—NO) or when the previously generated correction code is less than or equal to the sensing code value of the temporary code (S533—NO).

When the internal temperature is not included in the boundary portion of the sensing code (S531—NO) that means that the measured internal temperature is not adjacent to the boundary where the sensing code value is changed, and thus the sensing code value of the temporary code may represent the actual temperature.

On the other hand, when the previously generated correction code is less than or equal to the sensing code value of the temporary code (S533—NO), this indicates that the measured internal temperature is included in a boundary portion, that is, near the boundary where the sensing code value is changed and the sensing code value of the temporary code is greater than or equal to the previously generated correction code, and thus the semiconductor device may minimize the difference between the newly generated correction code and the previously generated correction code by outputting the sensing code value of the temporary code as the correction code as is.

FIGS. 7 to 10 are diagrams illustrating various memory systems according to various embodiments.

Figure 7:
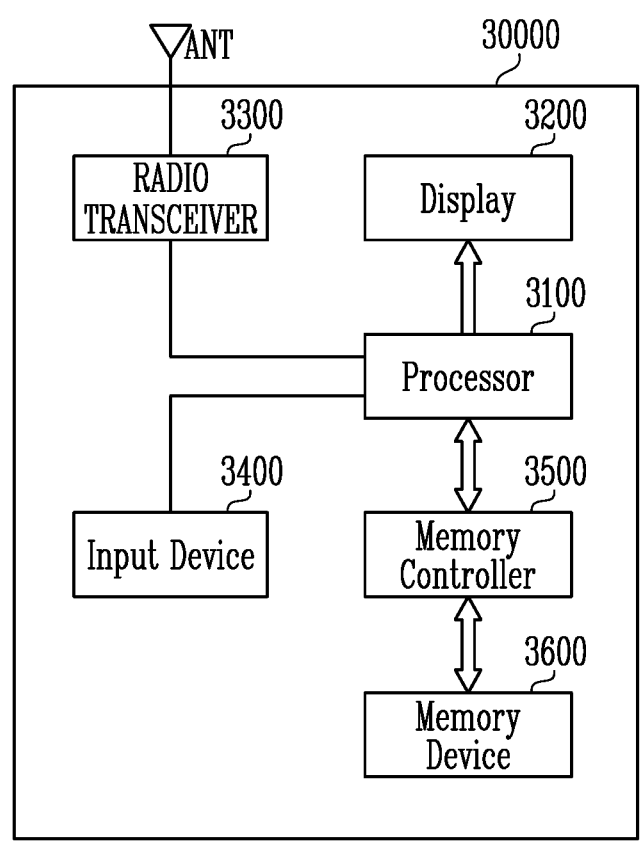
FIG. 7 is a diagram illustrating a memory system according various embodiments of the present disclosure.

Referring to FIG. 7, the memory system 30000 may be implemented as a cellular phone, a smart phone, a tablet PC, a personal digital assistant (PDA) or a wireless communication device. The memory system 30000 may include a memory device 3600 and a memory controller 3500 capable of controlling an operation of the memory device 3600. Here, the memory controller 3500 and the memory device 3600 may be implemented as the memory controller 2000 or the memory device 1000 described with reference to FIG. 1.

The memory controller 3500 may control a data access operation of the memory device 3600, for example, a program operation, an erase operation, or a read operation, under control of a processor 3100.

Data programmed in the memory device 3600 may be output through a display 3200 under the control of the memory controller 3500.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 3500 or the display 3200. The memory controller 3500 may transmit the signal processed by the processor 3100 to the memory device 3600. In addition, the radio transceiver 3300 may convert a signal output from the processor 3100 into a radio signal, and output the radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the memory controller 3500, data output from the radio transceiver 3300, or data output from the input device 3400 is output through the display 3200.

According to an embodiment, the memory controller 3500 capable of controlling the operation of memory device 3600 may be implemented as a part of the processor 3100 and may also be implemented as a chip separate from the processor 3100.

Figure 8:
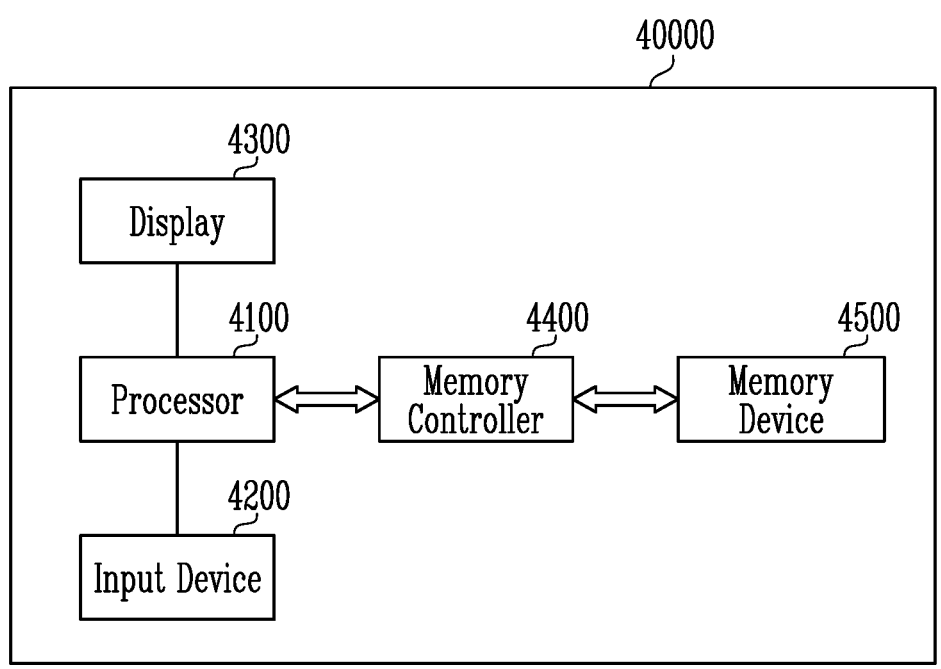
FIG. 8 is a diagram illustrating a memory system according to various embodiments of the present disclosure.

Referring to FIG. 8, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 4500 and a memory controller 4400 capable of controlling a data process operation of the memory device 4500. Here, the memory controller 4400 and the memory device 4500 may be implemented as the memory controller 2000 and the memory device 1000, respectively, described with reference to FIG. 1.

A processor 4100 may output data stored in the memory device 4500 through a display 4300, according to data input through an input device 4200. For example, the input device 4200 may be implemented as a point device such as a touch pad or a computer mouse, a keypad, or a keyboard.

The processor 4100 may control overall operation of the memory system 40000 and control an operation of the memory controller 4400. According to an embodiment, the memory controller 4400 capable of controlling the operation of memory device 4500 may be implemented as a part of the processor 4100 or may be implemented as a chip separate from the processor 4100.

Figure 9:
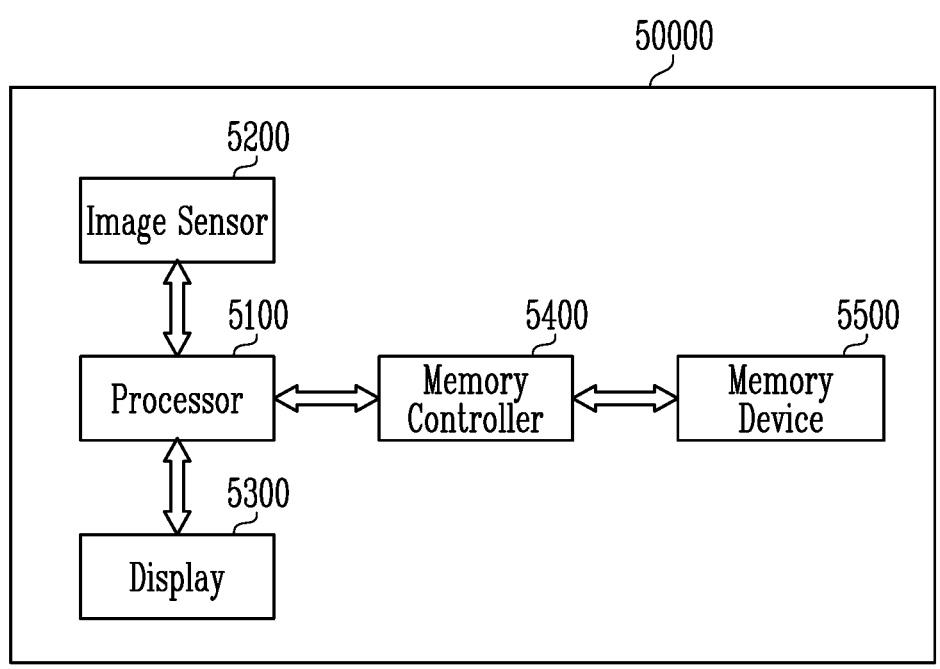
FIG. 9 is a diagram illustrating a memory system according to various embodiments of the present disclosure.

Referring to FIG. 9, the memory system 50000 may be implemented as an image processing device, for example, a digital camera, a portable phone provided with a digital camera, a smart phone provided with a digital camera, or a tablet PC provided with a digital camera.

The memory system 50000 includes a memory device 5500 and a memory controller 5400 capable of controlling a data process operation, for example, a program operation, an erase operation, or a read operation, of the memory device 5500.

An image sensor 5200 of the memory system 50000 may convert an optical image into digital signals. The digital signals may be transmitted to a processor 5100 or the memory controller 5400. Under control of the processor 5100, the digital signals may be output through a display 5300 or stored in the memory device 5500 through the memory controller 5400. In addition, data stored in the memory device 5500 may be output through the display 5300 under the control of the processor 5100 or the memory controller 5400.

According to an embodiment, the memory controller 5400 capable of controlling the operation of memory device 5500 may be implemented as a part of the processor 5100 or may be implemented as a chip separate from the processor 5100.

Figure 10:
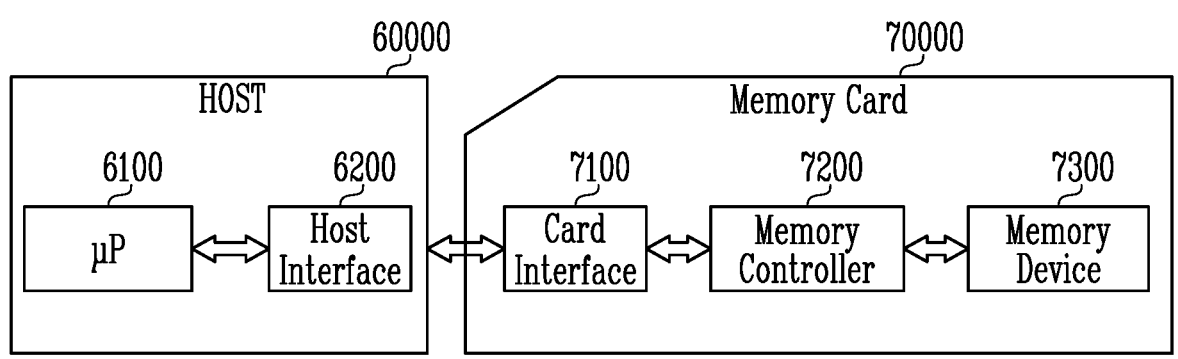
FIG. 10 is a diagram illustrating a memory system according to various embodiments of the present disclosure.

Referring to FIG. 10, the memory system 70000 may be implemented as a memory card or a smart card. The memory system 70000 may include a memory device 7300, a memory controller 7200, and a card interface 7100. The memory controller 7200 and the memory device 7300 may be implemented as the memory controller 2000 and the memory device 1000, respectively, described with reference to FIG. 1.

The memory controller 7200 may control data exchange between the memory device 7300 and the card interface 7100. According to an embodiment, the card interface 7100 may be a secure digital (SD) card interface or a multi-media card (MMC) interface, but the invention is not limited thereto.

The card interface 7100 may interface data exchange between a host 60000 and the memory controller 7200 according to a protocol of the host 60000. According to an embodiment, the card interface 7100 may support a universal serial bus (USB) protocol, and an interchip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 7300 through the card interface 7100 and the memory controller 7200 under control of a microprocessor (μp) 6100.

Although specific embodiments of the present invention are illustrated and described, various changes and modifications may be made without departing from the scope and technical spirit of the present invention. Therefore, the scope of the present invention is not limited to the above-described embodiments. Rather, the present invention encompasses all variations that fall within the scope of the claims.

What is claimed is:

1. A semiconductor device comprising:
   a sensing voltage generator configured to generate a temperature voltage having a voltage level determined according to an internal temperature of the semiconductor device and a reference voltage having a constant voltage level;
   a code generator configured to generate a temporary code including a sensing code value corresponding to the internal temperature and a boundary value indicating whether the internal temperature is included in a boundary portion associated with at least one temperature range corresponding to the sensing code value based on the temperature voltage and the reference voltage; and
   a code correction component configured to generate a correction code for generating an operation voltage of the semiconductor device by correcting the temporary code, based on the temporary code and a previously generated correction code.

2. The semiconductor device of claim 1, further comprising:
   a code register configured to store the previously generated correction code,
   wherein the code correction component generates the correction code by comparing the previously generated correction code stored in the code register with the sensing code value of the temporary code when the boundary value indicates that the internal temperature is included in the boundary portion.

3. The semiconductor device of claim 2, wherein the code correction component generates the correction code by adding a set value to the sensing code value of the temporary code when the sensing code value of the temporary code is less than the previously generated correction code.

4. The semiconductor device of claim 2, wherein the code correction component outputs the sensing code value of the temporary code as the correction code when the sensing code value of the temporary code is greater than or equal to the previously generated correction code.

5. The semiconductor device of claim 1, wherein the boundary portion is adjacent to a boundary at which the sensing code value is changed among temperature ranges corresponding to the sensing code value of the temporary code.

6. The semiconductor device of claim 1, wherein the internal operation includes at least one of a program operation, a read operation, or an erase operation, and
   the semiconductor device further comprises control logic configured to transmit a temperature measurement command for controlling to measure the internal temperature of the semiconductor device to the sensing voltage generator, in response to a command for controlling the semiconductor device to perform the internal operation from an external device.

7. The semiconductor device of claim 6, wherein the control logic transmits the temperature measurement command to the sensing voltage generator in response to a resume command for controlling the semiconductor device to resume the internal operation, when the internal operation is stopped while performing the internal operation.

8. The semiconductor device of claim 1, further comprising:
   a driving voltage generator configured to generate the operation voltage according to the correction code,
   wherein the operation voltage includes at least one of a program operation voltage, a read operation voltage, or an erase operation voltage.

9. The semiconductor device of claim 8, wherein the driving voltage generator changes the operation voltage when the correction code is changed, and a change value of the program operation voltage according to the change of the correction code is greater than a change value of the read operation voltage or a change value of the erase operation voltage.

10. A method of operating a semiconductor device, the method comprising:

generating a temperature voltage having a voltage level determined according to an internal temperature of the semiconductor device and a reference voltage having a constant voltage level;

generating a temporary code including a sensing code value corresponding to the internal temperature and a boundary value indicating whether the internal temperature is included in a boundary portion associated with at least one temperature range corresponding to the sensing code value based on the temperature voltage and the reference voltage; and generating a correction code for generating an operation voltage of the semiconductor device by correcting the temporary code, based on the temporary code and a previously generated correction code.

11. The method of claim 10, further comprising:
storing the previously generated correction code,
wherein generating the correction code comprises generating the correction code by comparing the previously generated correction code with the sensing code value of the temporary code when the boundary value indicates that the internal temperature is included in the boundary portion.

12. The method of claim 11, wherein generating the correction code comprises generating the correction code by adding a set value to the sensing code value of the temporary code when the sensing code value of the temporary code is less than the previously generated correction code.

13. The method of claim 11, wherein generating the correction code comprises outputting the sensing code value of the temporary code as the correction code when the sensing code value of the temporary code is greater than or equal to the previously generated correction code.

14. The method of claim 10, wherein the boundary portion is adjacent to a boundary at which the sensing code value is changed among temperature ranges corresponding to the sensing code value of the temporary code.

15. The method of claim 10, wherein the internal operation includes at least one of a program operation, a read operation, or an erase operation, and
the method further comprises transmitting a temperature measurement command for controlling to measure the internal temperature of the semiconductor device, in response to a command for controlling the semiconductor device to perform the internal operation from an external device.

16. The method of claim 15, further comprising:
transmitting the temperature measurement command in response to a resume command for controlling the semiconductor device to resume the internal operation, when the internal operation is stopped while performing the internal operation.

17. The method of claim 10, further comprising:
generating the operation voltage according to the correction code,
wherein the operation voltage includes at least one of a program operation voltage, a read operation voltage, or an erase operation voltage.

18. The method of claim 17, wherein generating the operation voltage comprises changing the operation voltage when the correction code is changed, and a change value of the program operation voltage according to the change of the correction code is greater than a change value of the read operation voltage or a change value of the erase operation voltage.

19. A memory device comprising:
a sensing voltage generator configured to generate a temperature voltage corresponding to an internal temperature of the memory device;
a code generator configured to generate a temporary code including a sensing code value corresponding to the internal temperature and a boundary value indicating whether the internal temperature falls within a boundary portion of two sensing code values based on the temperature voltage; and
a code correction component configured to selectively correct the temporary code based on the boundary value of the temporary code and a previously generated correction code and to output the temporary code or the corrected temporary code as a code for generating an operation voltage of the memory device.

* * * * *